(12) United States Patent
Assaderaghi et al.

(10) Patent No.: US 6,433,587 B1
(45) Date of Patent: Aug. 13, 2002

(54) SOI CMOS DYNAMIC CIRCUITS HAVING THRESHOLD VOLTAGE CONTROL

(75) Inventors: Fariborz Assaderaghi, Mahopac, NY (US); Kerry Bernstein, Underhill; Michael J. Hargrove, Clinton Corners, both of NY (US); Norman J. Rohrer, Underhill, VT (US); Peter Smeys, White Plaines, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/528,207

(22) Filed: Mar. 17, 2000

(51) Int. Cl.[7] .............................................. H03K 19/096
(52) U.S. Cl. ........................................... 326/95; 326/98
(58) Field of Search ...................................... 326/93–98

(56) References Cited

U.S. PATENT DOCUMENTS

| | | | |
|---|---|---|---|
| 5,115,150 A | * 5/1992 | Ludwig | 307/475 |
| 5,552,723 A | * 9/1996 | Shigehara et al. | 326/86 |
| 5,780,899 A | 7/1998 | Hu et al. | 257/335 |
| 5,815,005 A | 9/1998 | Bosshart | 326/95 |
| 5,821,769 A | 10/1998 | Douseki | 326/34 |
| 5,821,778 A | 10/1998 | Bosshart | 326/95 |
| 5,822,264 A | 10/1998 | Tomishima et al. | 365/222 |
| 5,825,696 A | 10/1998 | Hidaka et al. | 365/189.09 |
| 5,831,451 A | 11/1998 | Bosshart | 326/93 |
| 5,838,047 A | 11/1998 | Yamauchi et al. | 357/372 |
| 6,049,230 A | * 4/2000 | Durham et al. | 326/98 |
| 6,150,869 A | * 11/2000 | Storino et al. | 327/534 |

* cited by examiner

Primary Examiner—Michael Tokar
Assistant Examiner—Anh Tran
(74) Attorney, Agent, or Firm—Connolly Bove Lodge & Hutz LLP

(57) ABSTRACT

A circuit for maintaining the threshold voltages of transistors implemented in a dynamic CMOS circuit. A plurality of transistors have source drain connections connected between the body contacts of transistors in the dynamic CMOS circuits, and the constant voltage potential. When operating the dynamic CMOS circuit in the precharge phase, the body of each of the CMOS circuit transistors is maintained at the constant voltage potential. During the evaluate phase, the body potential is permitted to float to its precharge state. The initial reference level voltage established during a precharge phase maintains the transistor gate-source threshold voltage at a constant value, eliminating both bipolar effects and history effects which accompanying a changing body potential.

12 Claims, 3 Drawing Sheets

SOI CMOS DYNAMIC CIRCUITS HAVING THRESHOLD VOLTAGE CONTROL

BACKGROUND OF THE INVENTION

The present invention relates to electronic circuits implemented in SOI CMOS. Specifically, dynamic CMOS circuits are described where each circuit device has a threshold voltage which is controlled to reduce threshold variations.

CMOS circuits may be implemented as partial depletion SOI circuits which constitute logic circuits for producing a voltage on a node characterizing the logical combination of logic input signals. A clock signal controls two phases of operation, a precharge phase in which the node is set to the logical value which is a function of input conditions, and an evaluate stage wherein an output voltage representing the logic value is produced.

In partially depleted SOI CMOS circuit implementations, certain bipolar effects and history effects are experienced. The bipolar effects occur when a device connected to the charge node assumes a body potential which can result in bipolar current conduction during the evaluate phase, changing the node voltage and otherwise destroying data represented by the node voltage. History effects represent changes in the data propagation delay of the circuit which are significantly influenced by the change in transistor gate to source voltage thresholds. The gate to source voltage thresholds change as the device body voltage increases during the precharge phase. As the SOI body voltage of an NFET increases, the threshold voltage for the device decreases, varying the switching point. The change in threshold not only produces a change in device delay, it also produces changes in noise immunity. As the threshold voltage decreases the noise immunity for the device correspondingly decreases.

The present invention is directed to a circuit which inhibits charging of the transistor body potential in dynamic circuit applications, particularly in the partial depletion SOI CMOS environment.

SUMMARY OF THE INVENTION

A dynamic CMOS circuit is provided which produces a voltage on a charged node representing a logical function applied to input logic signals. The dynamic circuit is clocked with a clock input signal to establish a logical output for the circuit. The input transistors of the circuit which receive the logic input signals have a body contact which is connected to a voltage potential through a switching transistor so that during the precharge phase, the body potential of the input transistors is maintained at a constant reference voltage level. When the circuit enters the evaluate stage, the switching transistor is rendered into a non-conducting condition, and the body potential is permitted to float from its preestablished voltage level, and the node is charged to a value representing the logical function applied to the input signal conditions.

By pre-establishing a reference voltage level Vss on the body contact, the threshold voltage for the device remains substantially constant, and the delays through the circuit are stabilized. Additionally, by maintaining the body contact potential at a known level near the source potential, bipolar effects are minimized which would otherwise effect the node potential and corrupt the data represented by the node voltage.

DESCRIPTION OF THE PREFERRED EMBODIMENT

Figure 1:
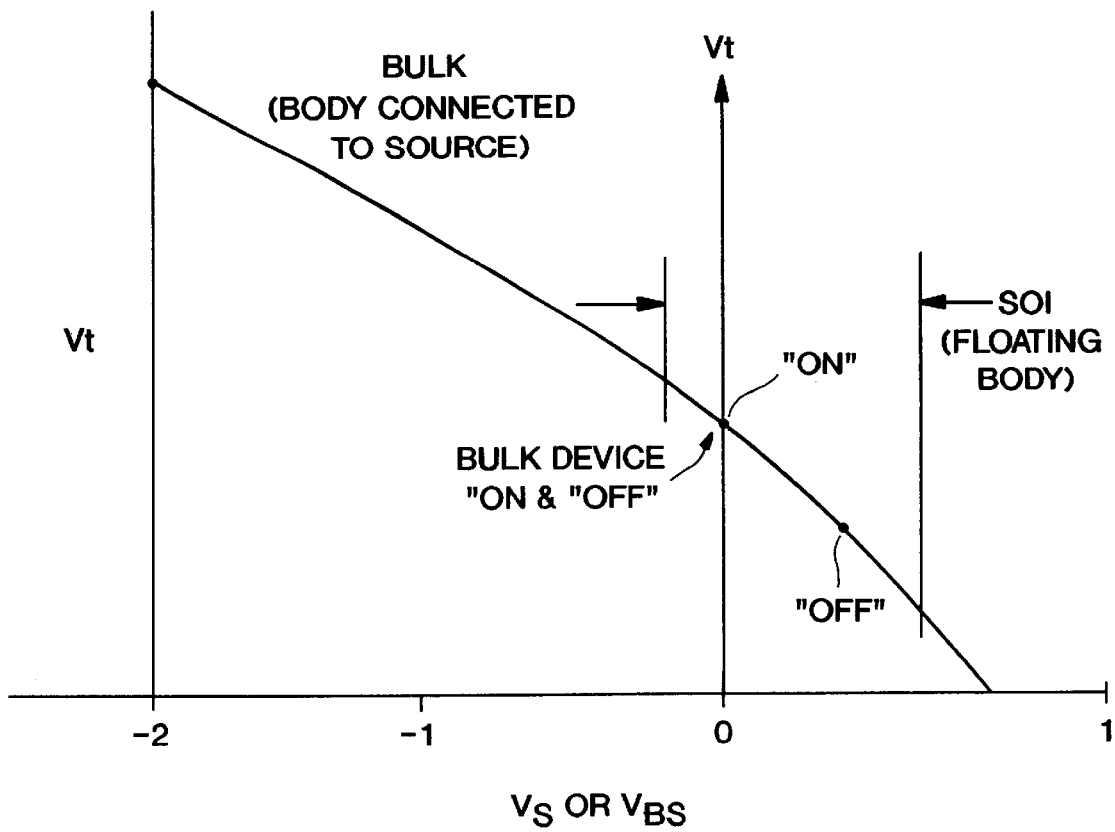
FIG. 1 illustrates the change of the gate-source threshold voltage $V_t$ with respect to changes in the body to gate potential of a SOI CMOS transistor.

SOI CMOS transistors operating in a partial depletion mode have a body-source threshold voltage characteristic $V_t$, shown in FIG. 1, which decreases with an increasing voltage on the body of the transistor relative to the transistor source. The figure represents the change in threshold voltage for devices which operate in the bulk region when the body potential is tied to the substrate potential, and in the SOI region when the body voltage is isolated from the source. As illustrated, when the device is in the SOI configuration, the body potential floats above the source potential. When the transistor is off the voltage for rendering the transistor conductive is less than the threshold voltage when the transistor is conducting.

Figure 2:
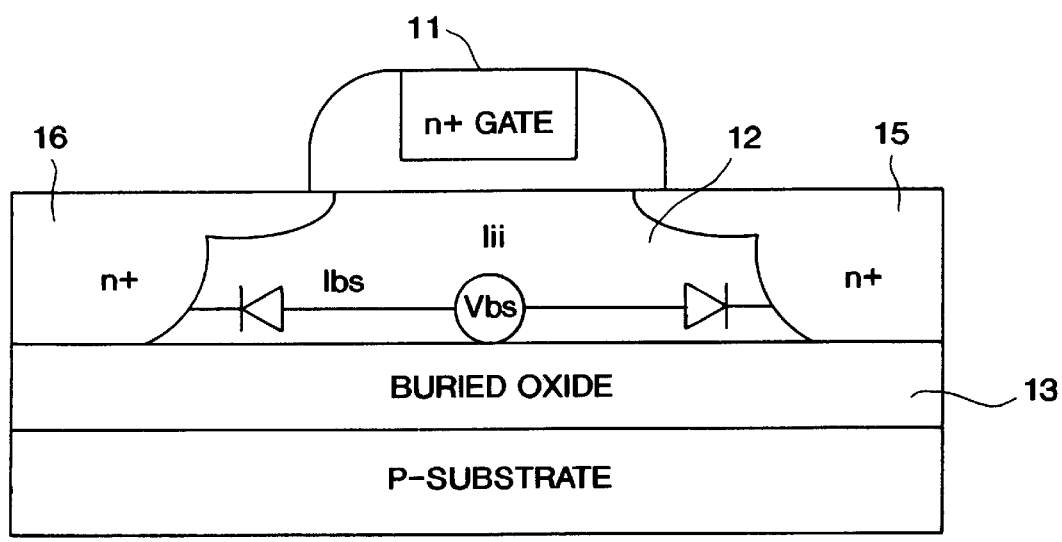
FIG. 2 is a section view of a SOI CMOS transistor which is subject to bipolar effects due to a body voltage which exceeds a source or drain voltage.

FIG. 2 is a cross-section showing a transistor implemented as a partial depletion SOI CMOS device. An insulated gate 11 controls current at the surface of the body 12 which is in contact with a buried oxide body 13. If the body 12 potential increases, to a point where the voltage exceeds the source 16 potential, bipolar effects are encountered and a current flows through the device even though the gate 11 is at a voltage which would normally not permit conduction through the diffusion channel 12. The net result of the bipolar effects can be a forward current flowing through a transistor which is supposed to be in a non-conductive state. If the device is connected to an output node, the charge on the node will decrease, destroying the data represented by the node potential.

Figure 3:
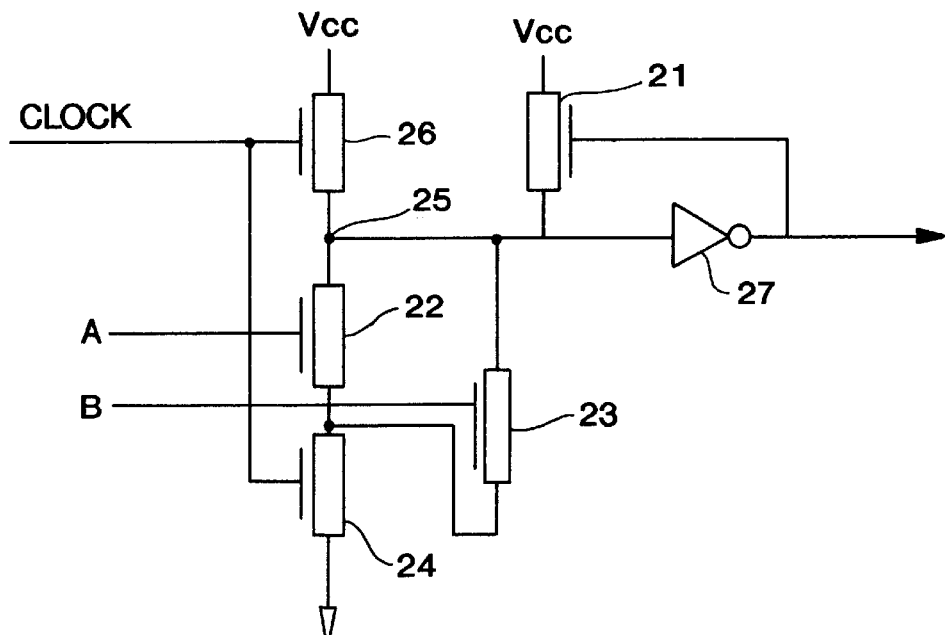
FIG. 3 illustrates a prior art dynamic CMOS circuit.

Bipolar effects are evident in a typical dynamic CMOS circuit shown in FIG. 3. Referring now to FIG. 3, a prior art OR gate is shown implemented in partial depletion CMOS. First and second input transistors 22 and 23 are connected to a node 25 which will charge to a potential representing a logical function of an input on the gates to transistor 22 or 23 during an evaluate phase. During the evaluate phase of the clock input signal, transistor 24 conducts, transistor 26 is non-conducting, and the node 25 assumes a charge depending on the logic state A or B applied to the gates of transistors 22 and 23. A foot transistor 24 pulls the sources of transistors 22 and 23 to ground. Transistor 21 is a half latch and inverter 27 inverts the potential appearing at output node 25.

During the precharge phase, the low clock input signal renders transistor 26 ON and transistor 24 non-conducting. Node 25 is brought to potential Vcc as p-transistor 26 is rendered conducting. The sources for transistors 22 and 23 may also reach Vcc since transistor 24 is OFF during the precharge phase. The result is that the body potential of transistors 22 and 23 may charge to a voltage Vcc, lowering the threshold $V_t$ as illustrated in FIG. 1, from 0.5 volts to 0.3 volts. As a result, the circuit is more sensitive to noise during the evaluation phase, when the clock input signal goes to logic 1 state, and transistor 26 is turned OFF, transistor 24 is turned ON, and node 25 assumes a potential depending on whether one or the other or both of transistors 22, 23 are conducting due to a logic state I on at least one of inputs A and B.

Additionally, the body potential on transistors 22 and 23 may cause the aforesaid bipolar events, where conduction occurs within devices 22 and 23 when the devices are supposed to be in a non-conductive state due to a logic input of zero applied to each of the gates of transistors 22 and 23. In this state, node 25 will discharge to an incorrect voltage which is lower than Vcc during the precharge phase.

The charge on the transistor body may also vary the threshold voltage $V_t$ over time, producing a corresponding change in the device delay representing history effects.

Figure 4:
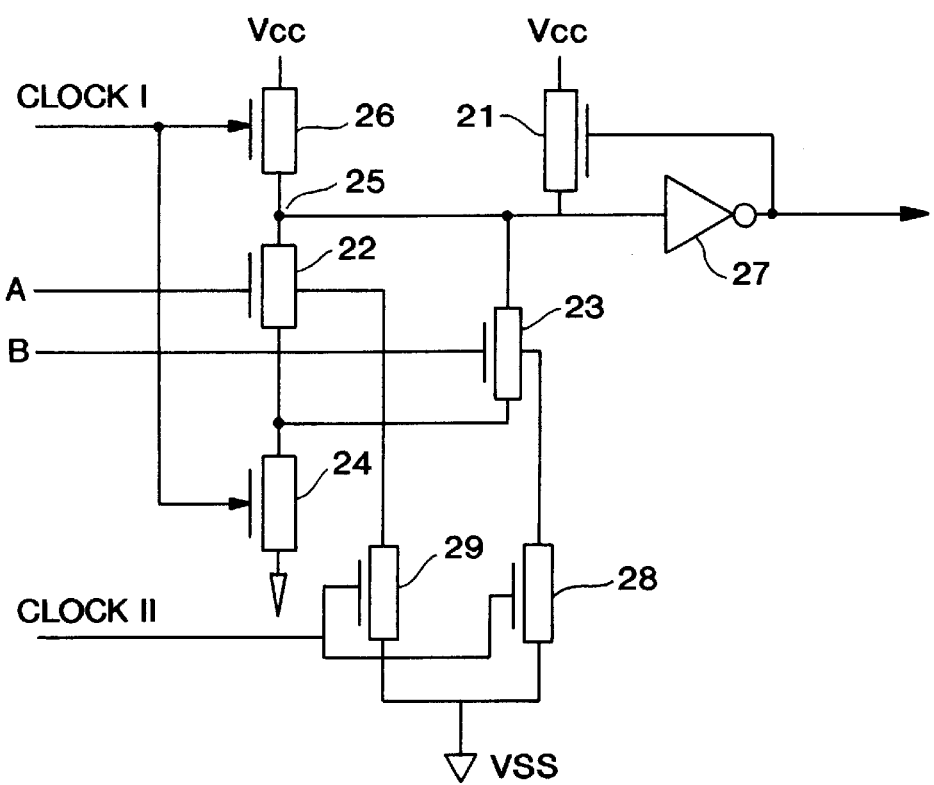
FIG. 4 illustrates one example of a dynamic CMOS circuit in accordance with a preferred embodiment having transistors which have a substantially constant threshold voltage $V_t$.

In accordance with a first embodiment of the invention, a solution to the foregoing problems which occur in dynamic CMOS circuits as a result of the body potential on transistor devices, is shown more particularly in FIG. 4. The circuit of FIG. 4 is an OR circuit for performing the same logic function as that of FIG. 3. The OR circuit comprises the same circuit elements with the addition of two switching transistors 28 and 29. Switching transistors 28 and 29 connect the body potential of the input transistors 22 and 23 to a bias voltage Vss. Vss is selected to be lower than Vcc, and may in some embodiments be the ground terminal of supply Vcc. Switching transistors 28 and 29 have gate connections connected to a second clock input C2. Clock C2 is substantially the complement of clock C1, so that during the precharge phase, the body potential of input transistors 22 and 23 is brought to the voltage level Vss. During the evaluate phase body potential of transistor 22 and 23 is permitted to float.

Thus, during the precharge phase when node 25 is brought to potential Vcc, the body potential of transistors 22. and 23 are maintained at, Vss. During the evaluate phase of clock signal C1, the body of transistors 22, 23 has been precharged to Vss, and the gate-source threshold voltage $V_t$ for input transistors 22 and 23 resets to a known value. The constant threshold voltage $V_t$ produces a constant delay through the circuit, reducing the history effects which occur when the body potential is permitted to change over time.

The foregoing embodiment contemplates returning the body potential for the input transistors 22 and 23 to a constant potential Vss. In some applications, it may only be necessary to provide a single switching device for controlling the body potential of a single transistor connected to the node to avoid the foregoing bipolar effects.

Figure 5:
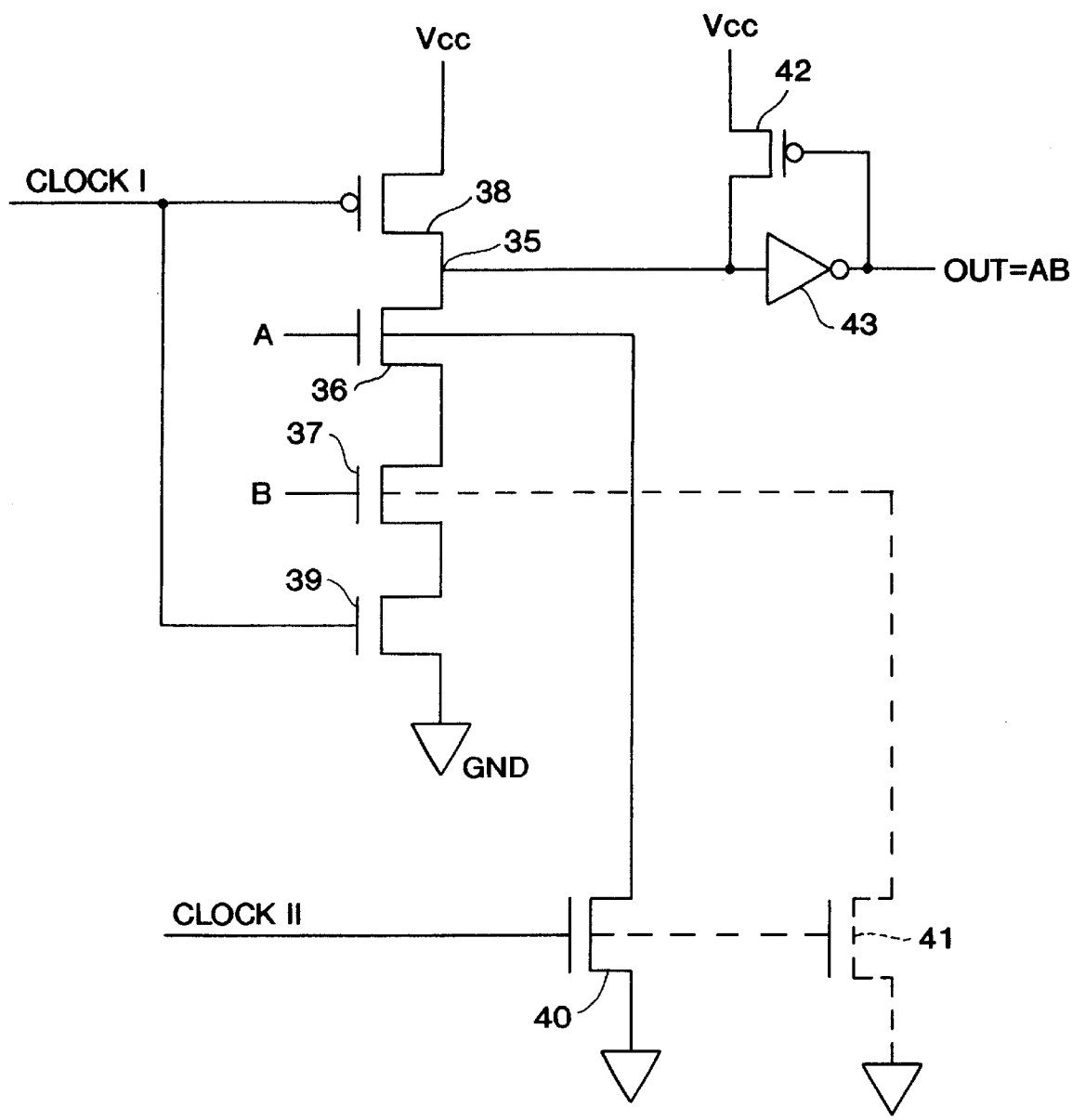
FIG. 5 illustrates a second example of a dynamic CMOS circuit in accordance with a second embodiment of the invention.

One such application is an AND gate shown more particularly in FIG. 5. The AND gate of FIG. 5 receives logic inputs A and B on inputs to N-type transistors 36 and 37. A pull up P-type transistor 38 forms with input transistors 36 and 37 a node 35. An inverter circuit comprising inverter 43 and pull up transistor 42 inverts the voltage appearing at node 35, and produces an output signal representing the logic states of inputs A and B.

The dynamic CMOS AND gate of FIG. 5 operates in response to the clock pulse Cl, so that during a precharge phase, node 35 is charged to a voltage level Vcc.

Additionally, a complementary clock signal C2 is supplied to a switching transistor 40, for maintaining the body of transistor 36 at the potential Vss during the precharge phase.

During an evaluate phase of the clock signal, transistor 38 is rendered conductive, and node 35 assumes a state depending on the logic inputs A and B. Since the body potential of transistor 36 has been set to Vss, bipolar effects are eliminated for transistor 36. As remaining input transistor 37 is not connected to the node 35, it is not necessary in this application to provide for lowering its body potential to Vss in order to protect node 35 from discharge due to bipolar effects.

However, in order to maintain constant voltage thresholds for transistors 36 and 37, a second switching transistor 41 may be provided to maintain the body potential of transistor 37 at the level Vss.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A logic circuit formed in an SOI type substrate and having a first input for receiving an evaluate signal and a plurality of logic inputs for receiving signals to be logically evaluated, comprising:

circuitry formed in the SOI type substrate and coupled to a body of at least one internal FET of the logic circuit and also coupled to a voltage terminal;

said circuit having a second input for receiving a clock signal having at least two alternating voltage levels, the second input coupled to the circuitry for effectuating a temporary pull down of the voltage level of the body in response to one of the clocks signal's voltage levels; and wherein the voltage level of the body is pulled to the voltage terminal level just prior to an evaluate phase of logic circuit.

2. The circuit of claim 1, wherein the circuitry allows the voltage level of the body to float in response to a second one of the clock signal's voltage levels.

3. The circuit of claim 2, wherein the clock signal is a complement of the evaluate signal.

4. The circuit of claim 1, wherein the circuitry comprises only a single control FET for each said internal FET to which the circuitry is coupled.

5. A dynamic CMOS circuit having transistors coupled to a charged node which control the voltage potential on the charged node representing a result of a logic operation, further comprising:

a plurality of switching transistors serially connecting the body of each transistor which is connected to said node to a reference potential voltage; and means for enabling said switching transistors during a precharge phase of said dynamic CMOS circuit whereby said body is established at a potential substantially equal to said reference potential.

6. The dynamic CMOS circuit according to claim 5, wherein said reference potential is lower than a precharge potential applied to said charge node.

7. The dynamic CMOS circuit according to claim 5, wherein said means for enabling said switching transistors provides a signal to a gate of said switching transistor switch is substantially a complement of a clocking signal applied to said CMOS circuit.

8. A dynamic CMOS circuit forming charged nodes with transistors which have a controlled threshold value comprising:
- a first transistor having a drain connected to a voltage source Vcc, and a gate connected to a source of clock signals;
- a second transistor serially connected with a source of said first transistor, forming node which can be charged to a voltage level Vcc when a clock pulse enables said first transistor to conduct;
- a third transistor connected with said second transistor and to a common terminal of said voltage source Vcc; and
- a fourth transistor having a source drain connected to a body contact of said second transistor and to a terminal of a second voltage supply, and having a gate connection connected to a source of pulses which enable said fourth transistor to conduct when said first transistor is conducting to apply a voltage to said second transistor body which prevents lowering of said second transistor threshold voltage.

9. The dynamic CMOS circuit according to claim 8 wherein said pulses applied to said fourth transistor are the complement of said clock pulses applied to said first transistor.

10. The dynamic CMOS circuit according to claim 8 further comprising:
- a fifth transistor having a drain source connection connected in parallel with said second transistor drain source connection, said fifth transistor gate connection being connected to receive a logic signal; and
- a sixth transistor having a drain source connection connected between a body contact on said fifth transistor and said second voltage supply, and having a gate connection connected to said source of pulses.

11. The circuit according to claim 8, further comprising:
- a pull up transistor connected to said node and said voltage source Vcc and;
- an inverter circuit connected to said node and a gate of said pull up transistor.

12. A circuit for maintaining the threshold voltage for transistors which form charged nodes in a dynamic CMOS circuit comprising:
- a plurality of transistors which have source drain connections connected between the body contacts of said transistors forming said charged nodes and a reference voltage, said transistors having a gate connection which is enabled during charging of said nodes of pulses which are complementary to clock pulses which enables charging of said nodes whereby said body contacts are maintained at a voltage which maintains said threshold voltages constant.

* * * * *